(12) United States Patent
Yata

(10) Patent No.: US 7,042,313 B2
(45) Date of Patent: May 9, 2006

(54) SURFACE ACOUSTIC WAVE DEVICE AND COMMUNICATION DEVICE USING THE SAME

(75) Inventor: Masaru Yata, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 31 days.

(21) Appl. No.: 10/343,715

(22) PCT Filed: Jun. 20, 2002

(86) PCT No.: PCT/IB02/02352

§ 371 (c)(1),
(2), (4) Date: Jun. 11, 2003

(87) PCT Pub. No.: WO03/001667

PCT Pub. Date: Jan. 3, 2003

(65) Prior Publication Data

US 2004/0106383 A1 Jun. 3, 2004

(30) Foreign Application Priority Data

Jun. 22, 2001 (JP) ............................. 2001-190168
May 9, 2002 (JP) ............................. 2002-134755

(51) Int. Cl.
*H03H 9/64* (2006.01)
*H03H 9/72* (2006.01)

(52) U.S. Cl. ...................... 333/193; 333/195; 333/133; 310/313 B

(58) Field of Classification Search ........ 333/193–196, 333/133; 310/313 B, 313 D
See application file for complete search history.

(56) References Cited

U.S. PATENT DOCUMENTS

| | | | | |
|---|---|---|---|---|
| 5,933,062 A | * | 8/1999 | Kommrusch | 333/193 |
| 6,037,847 A | * | 3/2000 | Ueda et al. | 333/193 |
| 6,114,926 A | * | 9/2000 | Ueda et al. | 333/193 |
| 6,483,402 B1 | * | 11/2002 | Endoh et al. | 333/193 |
| 6,556,100 B1 | * | 4/2003 | Takamine | 333/133 |
| 6,667,673 B1 | | 12/2003 | Strauss | 333/195 |
| 6,674,345 B1 | * | 1/2004 | Nakamura et al. | 333/193 |

FOREIGN PATENT DOCUMENTS

| | | |
|---|---|---|
| DE | 198 18 038 | 11/1999 |
| JP | 09-326669 | 12/1997 |
| JP | 2000-151337 | 5/2000 |
| JP | 2002-359541 | 12/2002 |
| JP | 2003-507917 | 2/2003 |
| WO | WO 00/69069 | 11/2000 |
| WO | WO 01/13514 | 2/2001 |

OTHER PUBLICATIONS

Official Communication issued on Oct. 4, 2005, in the corresponding Japanese Application No. 2002-134755.
English translation of Official Communication issued on Oct. 4, 2005, in the corresponding Japanese Application No. 2002-134755.

\* cited by examiner

*Primary Examiner*—Barbara Summons
(74) *Attorney, Agent, or Firm*—Keating & Bennett, LLP

(57) ABSTRACT

Two or more comb-shaped electrode portions (11, 12, 13, 21, 22, and 23) are provided on a piezoelectric substrate (60) so as to have a balanced-to-unbalanced conversion function. At least one of the adjacent electrode fingers at the boundaries of adjacent comb-shaped electrode portions (11, 12, 13, 21, 22, and 23) is connected to one of an unbalanced terminal (5) and balanced terminals (6 and 7).

9 Claims, 21 Drawing Sheets

SURFACE ACOUSTIC WAVE DEVICE AND COMMUNICATION DEVICE USING THE SAME

BACKGROUND OF THE INVENTION

1. Field of the Invention

The present invention relates to a surface acoustic wave device having a balanced-to-unbalanced conversion function and a filtering function, and a communication device including such a surface acoustic wave device.

2. Description of the Related Art

In recent years, the size and weight of communication devices, such as portable telephones, have been substantially reduced. Accordingly, not only has the number and size of components been reduced, but also multifunctional components have been developed.

Under such conditions, surface acoustic wave devices used in the RF stage of portable telephones, which have a balanced-to-unbalanced conversion function or the function of a so-called balun, have been rigorously studied in recent years and have commonly been used in GSM, and the possibility of these devices being used in PCS, DCS, etc., in future is very high.

Such surface acoustic wave devices having a balanced-to-unbalanced conversion function are disclosed in Japanese Unexamined Patent Application Publication No. 6-204781 and Japanese Unexamined Patent Application Publication No. 11-145772. In the above-mentioned surface acoustic wave devices, for example, the structure shown in FIG. 4 is widely used. The surface acoustic wave device shown in FIG. 4 includes a surface acoustic wave filter 3 shown in FIG. 5 and a surface acoustic wave filter 4 shown in FIG. 6, in which the phase is 180 degrees offset from that of the above surface acoustic wave filter 3, on a piezoelectric substrate (the piezoelectric substrate is omitted).

The surface acoustic wave filter 3 is a longitudinally coupled resonator type surface acoustic wave filter having three comb-shaped electrode portions (hereinafter called IDTs) where an IDT 31 and an IDT 33 are arranged on the left and right sides of a middle IDT 32 along the propagation direction of a surface acoustic wave, and reflectors 14 and 15 are arranged so as to sandwich the IDTs 31, 32, and 33.

The surface acoustic wave filter 4 is a longitudinally coupled resonator type surface acoustic wave filter having three IDTs where an IDT 41 and an IDT 43 are arranged on the left and right sides of a middle IDT 42 and reflectors 14 and 15 are arranged so as to sandwich the IDTs 41, 42, and 43.

In the surface acoustic wave filter 3 and the surface acoustic wave filter 4, the phase of the middle IDT 32 and IDT 42 is 180 degrees offset from each other, that is, the polarity of the electrode-finger portions 32a and 32b of the IDT 32 is opposite to the polarity of the electrode-finger portions 42a and 42b of the IDT 42.

The terminal connected to the electrode-finger portion 31b of the IDT 31 and the electrode-finger portion 33b of the IDT 33 defines one balanced terminal 6. The terminal connected to the electrode-finger portion 41b of the IDT 41 and the electrode-finger portion 43b of the IDT 43 defines another balanced terminal 7. The terminal connected to the electrode-finger portion 32b of the IDT 32 and the electrode-finger portion 42a of the IDT 42 defines a further unbalanced terminal 5.

In a surface acoustic wave device having a balanced-to-unbalanced conversion function, with respect to the transmission characteristics inside the passband between the unbalanced signal terminal and each of the balanced signal terminals, the amplitude characteristics must be equal and the phase must be 180 degrees offset between them and, outside the passband, the amplitude characteristics and the phase characteristics must be equal between them.

Regarding the amplitude balancing and phase balancing, when a surface acoustic wave device having the above-described balanced-to-unbalanced conversion function is referred to as a three-port device and, for example, the unbalanced input terminal is referred to as a first port and the balanced output terminals are referred to as a second port and a third port, respectively, the amplitude balancing and the phase balancing are defined as follows. Amplitude balancing=$|A|$, $A=|20 \log(S21)|-|20 \log(S31)|$, and phase balancing=$|B-180|$, $B=|\angle S21-\angle S31|$. Moreover, S21 is a transfer factor from the first port to the second port and S31 is a transfer factor from the first port to the third port. Regarding such balancing between balanced signal terminals, ideally the amplitude balancing is 0 dB and the phase balancing is zero degree inside the passband of the surface acoustic wave device.

However, in the surface acoustic device shown in FIG. 4, there are differences from the ideal balancing and the level of the differences cause problems when practically used. That is, in the surface acoustic wave filter 3 of the related surface acoustic wave device, each of the electrode-finger portions 31a, 32a, and 33a to which the outermost finger electrodes at the boundaries between the three IDTs (IDT31, IDT32, and IDT33) belong is grounded.

On the other hand, in the surface acoustic wave filter 4 of the related surface acoustic wave device, regarding the electrode-finger portions 41a, 42a, and 43a to which the outermost finger electrodes at the boundaries between the three IDTs (IDT41, IDT42, and IDT43) belong, the electrode-finger portions 42a of the IDT 42 is connected to the unbalanced terminal 5 to define a signal terminal and each of the electrode-finger portions 41a and 43a of the IDT 41 and IDT 43 is grounded.

Therefore, at the boundaries between the IDTs 31, 32, and 33 of the surface acoustic wave filter 3, since the grounded electrode-finger portions 31a, 32a, and 33a are adjacent to each other, no surface acoustic wave is excited. However, at the boundaries between the IDTs 41, 42, and 43 of the surface acoustic wave filter 4, since the electrode-finger portion 42a connected to the unbalanced terminal 5 produces a potential difference to the grounded electrode-finger portions 41a and 43a, a surface acoustic wave is excited.

In this manner, between the surface acoustic wave filter 3 and the surface acoustic wave filter 4, since there is a difference whether a surface acoustic wave is excited at the boundaries between adjacent IDTs or not, filtering characteristics are substantially different. This fact causes a problem in that the balancing, particularly the balancing inside the passband, is greatly deteriorated in the above-described related surface acoustic wave device.

SUMMARY OF THE INVENTION

In order to overcome the above-described problems, preferred embodiments of the present invention provide a surface acoustic wave device having a balanced-to-unbalanced conversion function, in which filtering characteristics of two surface acoustic wave filters are substantially the same by changing the arrangement of polarities of electrode fingers at the boundaries between IDTs and the balancing, particularly the balancing inside the passband is greatly improved, and also provide a communication device including such a novel surface acoustic wave device.

A surface acoustic wave device according to a preferred embodiment of the present invention includes a piezoelectric substrate, at least one surface acoustic wave filter including at least two comb-shaped electrode portions provided along a propagation direction of surface acoustic waves propagated on the piezoelectric substrate, the at least one surface acoustic wave filter arranged on the piezoelectric substrate so as to have a balanced-to-unbalanced conversion function. At least one electrode finger of outermost electrode fingers in each of adjacent comb-shaped electrode portions is connected to a signal terminal.

According to the above-described surface acoustic wave device, since at least two comb-shaped electrode portions are arranged along the propagation direction of a surface acoustic wave on a piezoelectric substrate, a passband and a stopband defined by the piezoelectric substrate and the comb-shaped electrode portions are set and an outstanding filtering function is achieved. Furthermore, since one or more surface acoustic wave filters are provided so as to have a balanced-to-unbalanced conversion function, signal terminals of balanced terminals and unbalanced terminals are provided.

In addition, in the above-described surface acoustic wave device, since at least one electrode finger of the outermost electrode fingers in adjacent comb-shaped electrode portions is connected to a signal terminal, grounding both of the adjacent outermost electrode fingers is prevented. Therefore, in the above-described surface acoustic wave device, the difference of characteristics between comb-shaped electrode portions which is caused by grounding both of the adjacent outermost electrode fingers is greatly reduced, and the balancing between the balanced terminals is greatly improved.

A surface acoustic wave device according to another preferred embodiment of the present invention includes a piezoelectric substrate, at least one surface acoustic wave filter including at least two comb-shaped electrode portions provided along a propagation direction of surface acoustic waves on the piezoelectric substrate, the at least one surface acoustic wave filter being arranged on the piezoelectric substrate so as to have a balanced-to-unbalanced conversion function. Electrode fingers facing each other in each of adjacent comb-shaped electrode portions are arranged to excite a surface acoustic wave between the electrode fingers.

According to the above-described surface acoustic wave device, since the facing electrode fingers in adjacent comb-shaped electrode portions are arranged to excite a surface acoustic wave between the electrode fingers, the difference of characteristics between comb-shaped electrode portions, which is caused when the surface acoustic waves are not excited between the above electrode fingers, is prevented, and the balancing between balanced terminals is greatly improved.

In the above-described surface acoustic wave device, the surface acoustic wave filter is preferably a longitudinally coupled resonator type surface acoustic wave filter. Further in the above-described surface acoustic wave device, the surface acoustic wave filter preferably includes three comb-shaped electrode portions.

According to the above-described surface acoustic wave device, since the surface acoustic wave filter is a longitudinally coupled resonator type surface acoustic wave filter or includes three comb-shaped electrode portions, a balanced-to-unbalanced conversion function is easily achieved.

In the above-described surface acoustic wave device, two surface acoustic wave filters, in which the phase is 180 degrees offset from each other, are preferably included. According to the above-described configuration, because the phase of the two surface acoustic wave filters is 180 degrees offset from each other, a balanced-to-unbalanced conversion function is more effectively achieved, the attenuation in a stopband is increased by using a plurality of surface acoustic wave filters, and filtering characteristics are greatly improved.

In the above-described surface acoustic wave device, the surface acoustic wave filter includes the three comb-shaped electrode portions provided along the propagation direction of the surface acoustic waves, the middle comb-shaped electrode portion is connected to an unbalanced terminal and the left and right comb-shaped electrode portions are connected to balanced terminals, and the phase of the left and right comb-shaped electrode portions is 180 degrees offset from each other.

According to the above-described configuration, since the phase of the left and right comb-shaped electrode portions is 180 degrees offset from each other, a balanced-to-unbalanced conversion function is achieved by using one surface acoustic wave filter. Therefore, the configuration of the above-described surface acoustic wave device is simplified.

A communication device according to another preferred embodiment of the present invention includes surface acoustic wave devices according to preferred embodiments of the present invention described above. Since the communication device has a complex structure having a filtering function and a balanced-to-unbalanced conversion function, the size of the communication device is greatly reduced, and, in addition, the balancing is greatly improved, the transmission characteristics are outstanding, and the communication capability is greatly improved.

As described above, a surface acoustic wave device according to preferred embodiments of the present invention has a function of conversion between balanced and unbalanced signals and greatly improves the balancing, particularly the amplitude balancing within the passband, such that at least one of the outermost electrode fingers is connected to a signal terminal and grounded electrode fingers disposed side by side is prevented.

Furthermore, in the above-described configuration, an increased bandwidth is produced in comparison with related examples.

Other feature, elements, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, preferred embodiments of the present invention are described with reference to FIGS. 1 to 22.

Figure 1:
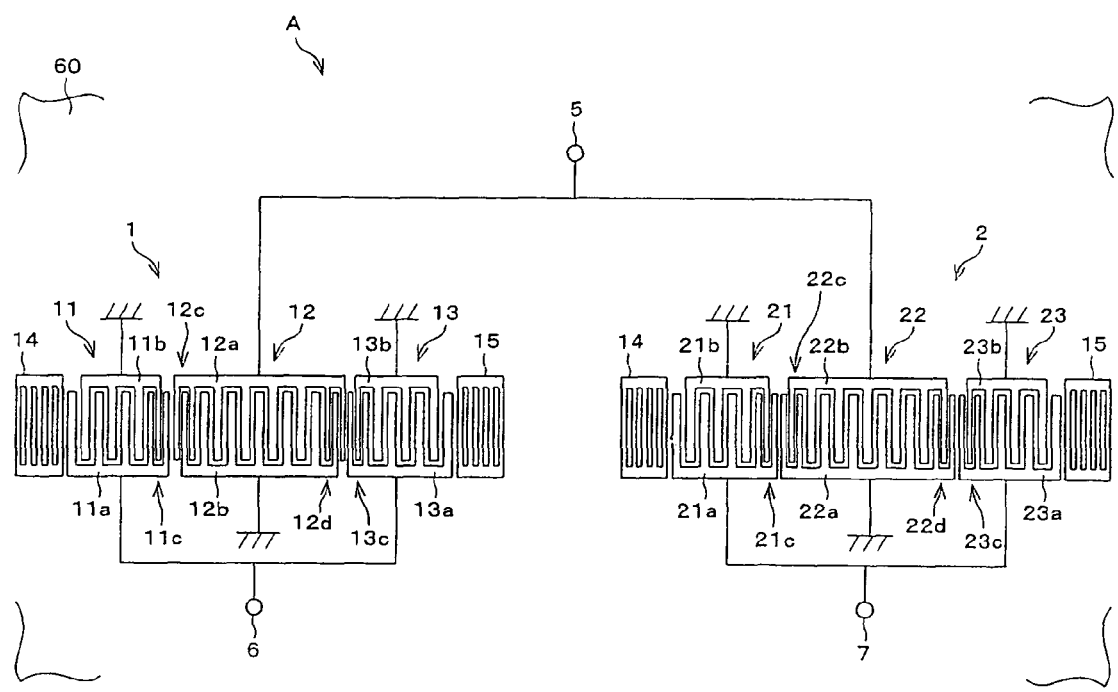
FIG. 1 shows a surface acoustic wave device according to a preferred embodiment of the present invention.
Figure 2:
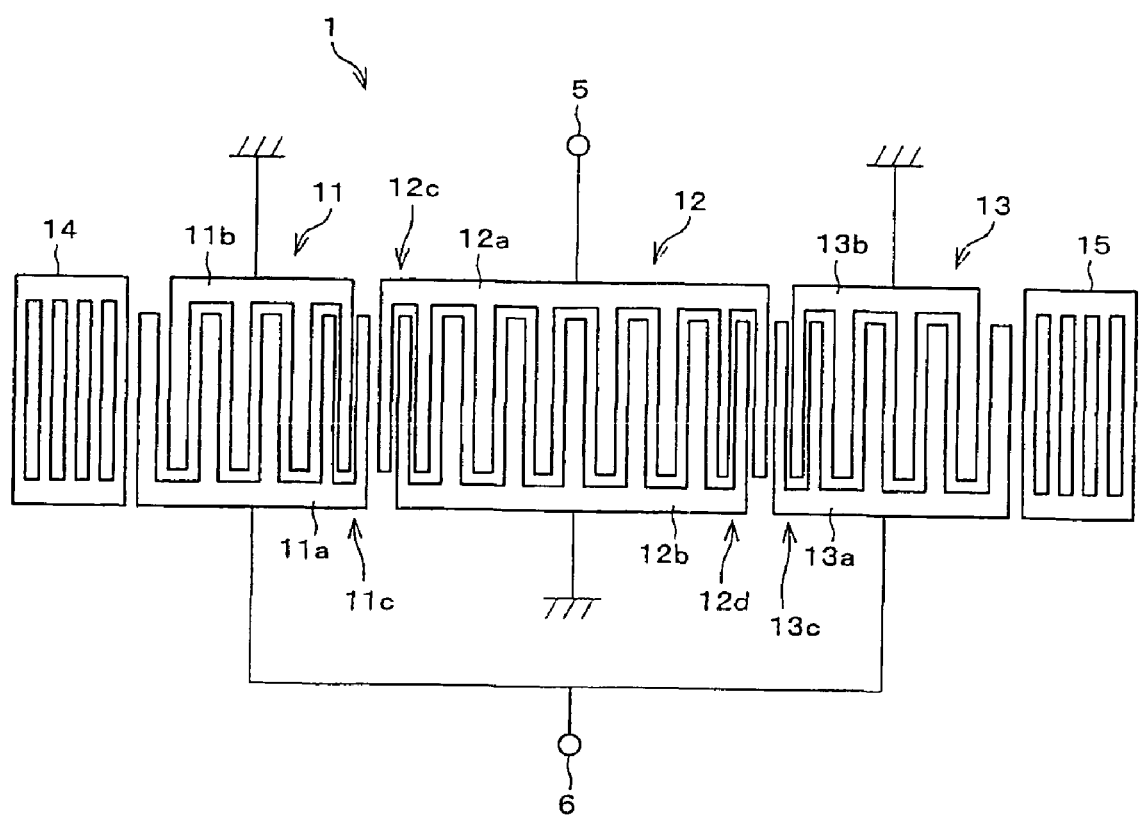
FIG. 2 shows one surface acoustic wave filter of a surface acoustic wave device shown in FIG. 1.
Figure 3:
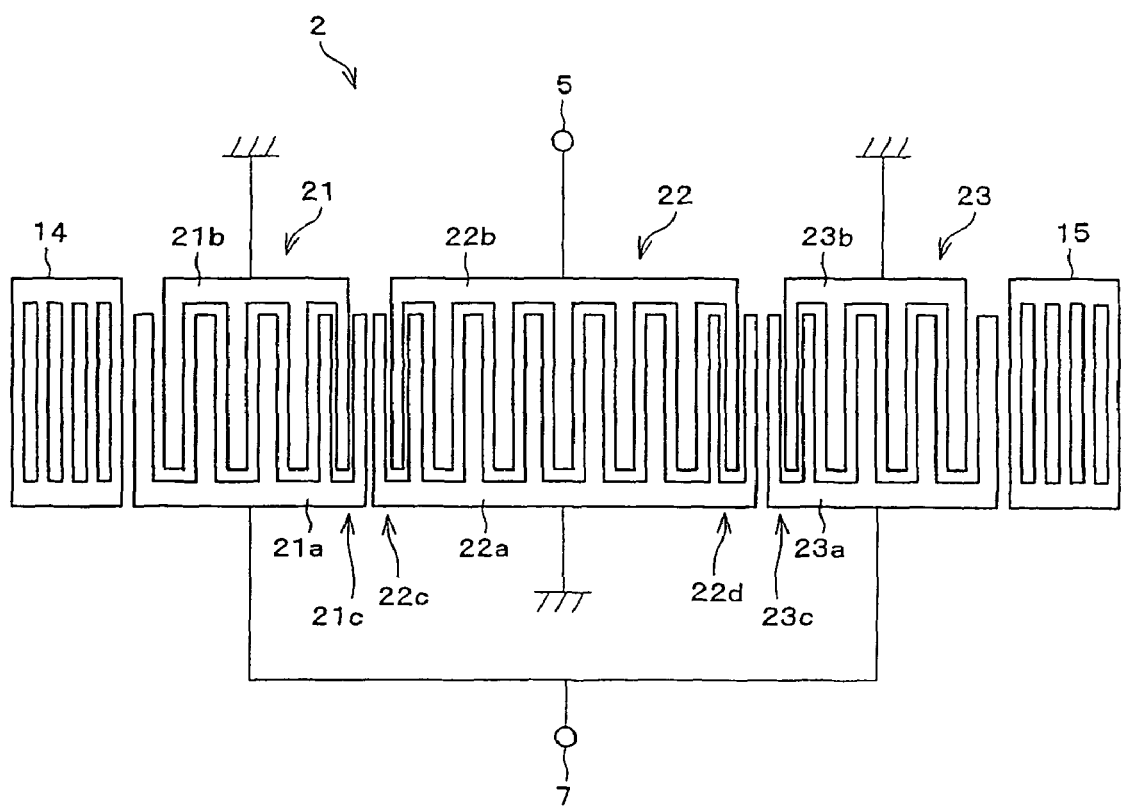
FIG. 3 shows the other surface acoustic wave filter of a surface acoustic wave device shown in FIG. 1.

A surface acoustic wave device A according to EXAMPLE 1 of preferred embodiments of the present invention is shown in FIG. 1. Moreover, in each of the following examples, a DCS (Digital Communication System) receiving filter is illustrated and described, as an example. In a surface acoustic wave device A according to EXAMPLE 1, as shown in FIGS. 1 to 3, two longitudinally coupled resonator type surface acoustic wave filters 1 and 2 are provided on a piezoelectric substrate 60 made of, for example, a material of 40±5° Y-cut X propagation LiTaO$_3$ by using aluminum electrodes (foils) formed by a method of photolithography, or other suitable method. Each of the surface acoustic wave filters 1 and 2 is arranged along the propagation direction of a surface acoustic wave. Thus, miniaturization is achieved.

The surface acoustic wave filter 1 includes at least two, and preferably three IDTs 11, 12, and 13 arranged in this order along the propagation direction of a surface acoustic wave, and reflectors 14 and 15 arranged so as to sandwich the IDTs 11, 12, and 13. The surface acoustic wave filter 2 includes at least two, and preferably three IDTs 21, 22, and 23 arranged in this order along the propagation direction of a surface acoustic wave, and reflectors 14 and 15 arranged so as to sandwich the IDTs 21, 22, and 23.

The IDTs 11, 12, 13, 21, 22, and 23 are provided with two electrode-finger portions having belt-shaped base end portions (bus bars) and a plurality of electrode fingers, arranged substantially parallel to each other, which extend from one side portion of the base end portion in the direction that is substantially perpendicular to the base end portion, each of the above electrode-finger portions is arranged such that the electrode fingers are inserted between the other electrode fingers and the side portions of the electrode fingers of each of the above electrode-finger portions face each other, and each is provided with an odd total number of electrode fingers.

In the IDT 11, signal conversion characteristics and passbands are determined by setting the length and width of each electrode finger, the space between adjacent electrode fingers, and the cross width showing the length where electrode fingers inserted between the other electrode fingers face each other. Furthermore, the other IDTs to be described later are constructed and function in the same manner.

The reflectors reflect a surface acoustic wave propagated to the reflectors and return the wave in the direction in which the wave was propagated. That is, the reflectors are provided with a pair of belt-shaped base end portions (bus bars) and a plurality of electrode fingers, which are substantially parallel to each other, which extends from one side portion of each base end portion in the direction that is substantially perpendicular to the long side of the base end portion and which link each of the end portions.

In this manner, the reflectors are excited by a propagated surface acoustic wave, such that a surface acoustic wave generated by the excited electric signal offsets the traveling surface acoustic wave, and a new surface acoustic wave in the opposite direction to the propagation direction of the above surface acoustic wave is generated. Therefore, the reflectors function as pseudo reflectors of a propagated surface acoustic wave.

The surface acoustic wave filter 1 is configured such that the IDTs 11 and 13 are arranged to sandwich the IDT 12 from its left and right sides along the propagation direction of a surface acoustic wave and the reflectors 14 and 15 are arranged to sandwich the IDTs 11 and 13. Therefore, the length direction of the electrode fingers of each of the IDTs 11, 12, and 13 and each of the reflectors 14 and 15 are arranged so as to be substantially perpendicular to the propagation direction of a surface acoustic wave.

Furthermore, in the above surface acoustic wave device A, the pitch of a few electrode fingers (narrow-pitched electrode fingers) is preferably narrower than the pitch of the other electrode fingers of the IDTs at the locations where the IDT 12 and the IDTs 11 and 13 are adjacent to each other and the IDT 22 and the IDTs 21 and 23 are adjacent to each other (locations 11c, 12c, 12d, 13c, 21c, 22c, 22d, and 23c in FIGS. 1 to 3). In this manner, the insertion loss is greatly reduced.

Moreover, the space between IDTs at the adjacent locations where the IDTs 11 and 12 are farther from each other (locations between 1c and 12c and between 22d and 23c shown in FIGS. 1 to 3) is greater than the space between IDTs at the other adjacent locations (locations between 12d and 13c and between 21c and 22c shown in FIGS. 1 to 3).

In addition, each of the IDT and the IDT 22 is arranged so as to be symmetric with respect to a line of the propagation direction of a surface acoustic wave. Because of this, the phases of the IDT 12 and the IDT 22 are 180 degrees offset from each other. Therefore, the IDT 12 and IDT 22 perform a function of conversion between balanced and unbalanced. In FIGS. 1 to 3, the number of electrode fingers is reduced to simplify the drawings.

Since the total number of electrodes is odd, the IDT 11 has an electrode-finger portion 11a and an electrode-finger portion 11b in which the number of electrode fingers is less than that of the electrode-finger portion 11a. In the IDT 11, the electrode fingers (outermost electrode fingers) at both ends in the propagation direction of a surface acoustic wave are defined by the electrode-finger portion 11a. Furthermore, in the same manner, since the total number of electrode fingers is odd, the IDT 13 has an electrode-finger portion 13a and an electrode-finger portion 13b in which the number of electrode fingers is less than that of the electrode-finger portion 13a. Accordingly, in the IDT 13, the electrode fingers (outermost electrode fingers) at both ends in the propagation direction of a surface acoustic wave are defined by the electrode-finger portion 13a.

In the above-described surface acoustic wave device A, at least one electrode finger of the adjacent outermost electrode fingers of the IDTs, which are adjacent to each other, is connected to a signal terminal. That is, the electrode fingers, facing each other, of the IDTs, which are adjacent to each other, are arranged such that a surface acoustic is excited between the electrode fingers.

The specific description of such a configuration will now be given. In the surface acoustic wave filter 1, the electrode-finger portion 11a and the electrode-finger portion 13a are connected to a balanced terminal 6, and each of the electrode-finger portion 11b and the electrode-finger portion 13b is grounded.

In the surface acoustic wave filter 2, the electrode-finger portions 21a and 23a having more electrode fingers of the IDTs 21 and 23 are also connected to the other balanced terminal 7, and the surface acoustic wave filter 2 is preferably the same as the surface acoustic wave filter 1 except that the IDT 22 is different from the IDT 12 as will be described later.

Since the total number of electrodes is odd, the IDT 12 has an electrode-finger portion 12a and an electrode-finger portion 12b in which the number of electrode fingers is less than in the electrode-finger portion 12a. Accordingly, in the IDT 12, the electrode fingers (outermost electrode fingers) at both ends in the propagation direction of a surface acoustic wave are defined by the electrode-finger portion 12a. The electrode-finger portion 12a is connected to an unbalanced terminal 5. The electrode-finger portion 12b is grounded. Furthermore, since the total number of electrodes is odd, the IDT 22 has an electrode-finger portion 22a and an electrode-finger portion 22b in which the number of electrode fingers is less than in the electrode-finger portion 22a. Accordingly, in the IDT 22, the electrode fingers (outermost electrode fingers) at both ends in the propagation direction of a surface acoustic wave are defined by the electrode-finger portion 22a. The electrode-finger portion 22a is grounded. The electrode-finger portion 22b is connected to the unbalanced terminal 5.

Therefore, in the above surface acoustic wave device A, at least one of the outermost electrode fingers of the IDTs, which are adjacent to each other, is connected to the unbalanced terminal 5 or the balanced terminals 6 and 7 as a signal terminal.

Figure 4:
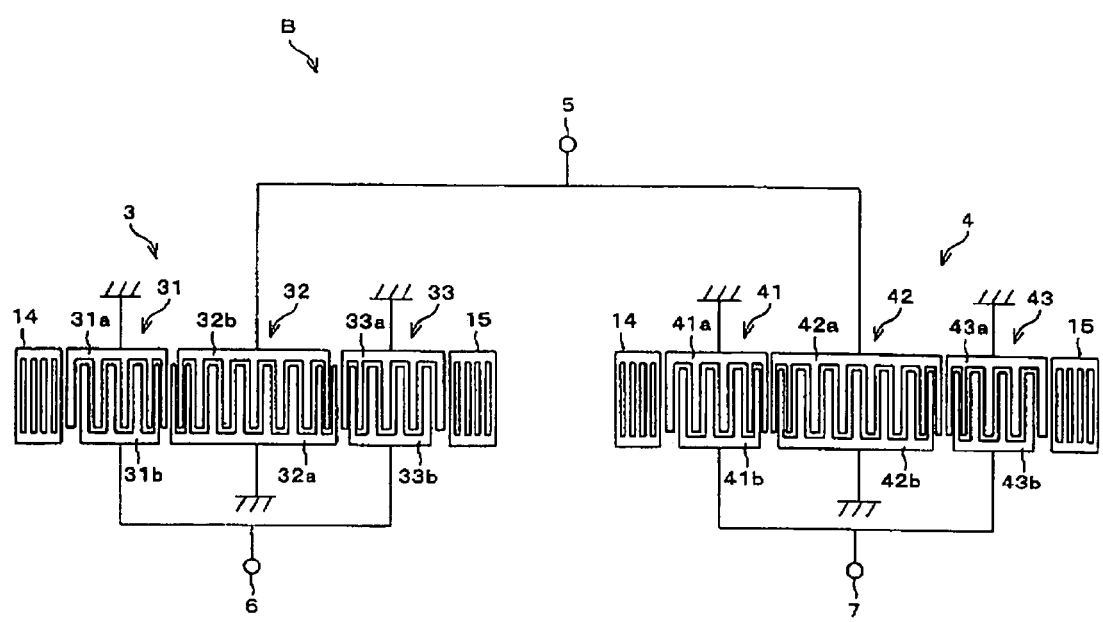
FIG. 4 shows a surface acoustic wave device of a related example.

Next, for comparison, a surface acoustic wave filter 3 (surface acoustic wave filter shown in FIG. 5), which is used in a surface acoustic wave device B in FIG. 4 showing a related surface acoustic wave device (RELATED EXAMPLE 1), and three other surface acoustic wave filters, which are constructed by reversing the electrode polarities in the surface acoustic wave filter 3, are described.

The surface acoustic wave filter 3 is a longitudinally coupled resonator type surface acoustic wave filter having three IDTs, the IDT 31 and IDT 33 are arranged at the left and right sides of the central IDT 32 in the propagation direction of a surface acoustic wave as described above, and the reflectors 14 and 15 are arranged on both sides of the left and right IDTs 31 and 33.

Figure 5:
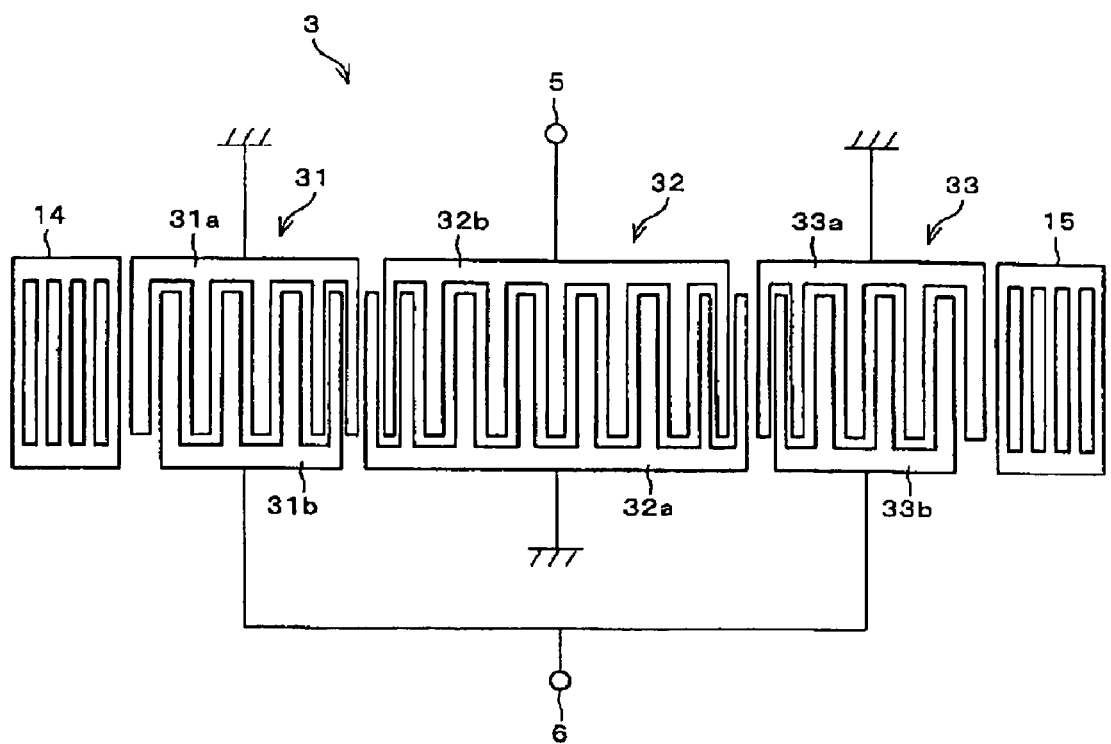
FIG. 5 shows one surface acoustic wave filter of a surface acoustic wave device of the related example.
Figure 6:
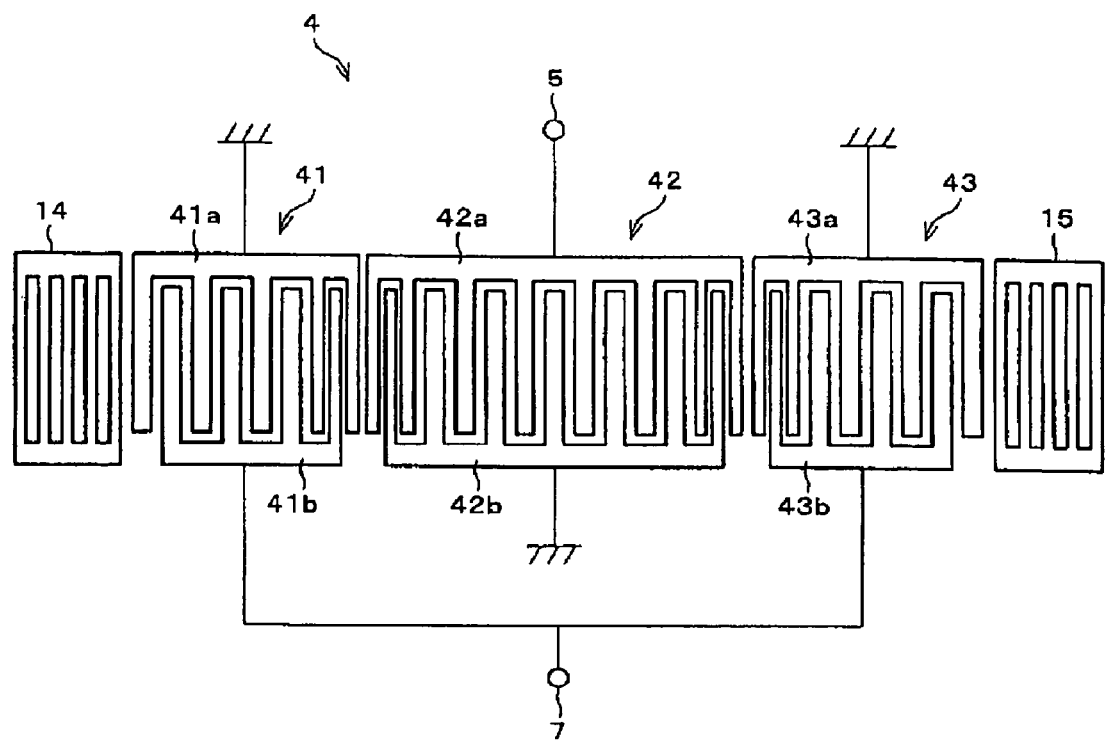
FIG. 6 shows the other surface acoustic wave filter of a surface acoustic wave device of the related example.

A surface acoustic wave filter 4 shown in FIG. 6 has the same structure as the surface acoustic wave filter 3 in FIG. 5 except that the IDT 32 is replaced with an IDT 42 in which the polarity of the IDT 32 is reversed, and the surface acoustic wave filter 4 is 180 degrees offset in phase from the surface acoustic wave filter 3 in FIG. 5. The surface acoustic wave filter 1 in FIG. 2 includes three IDTs 11, 12, and 13 having the polarity of all the three IDTs (IDT 31, IDT 32, and IDT 33) in FIG. 5 reversed and has the same phase as in FIG. 5.

The surface acoustic wave filter 2 in FIG. 3 described earlier is configured such that the polarity of all the three IDTs (IDT 41, IDT 42, and IDT 43) is reversed and has the same phase as in FIG. 6. From another point of view, in FIGS. 3 and 5, since the polarity of the left and right IDTs is reversed, the filters are 180 degrees different in phase from each other, and, in the same way, in FIGS. 2 and 6, since the polarities of the left and right IDTs are reversed, the filters are 180 degrees different in phase from each other.

Accordingly, the surface acoustic wave filters shown in FIGS. 2 and 5 are 180 degrees offset in phase from the surface acoustic wave filters shown in FIGS. 3 and 6. These relationships are summarized as in Table 1.

TABLE 1

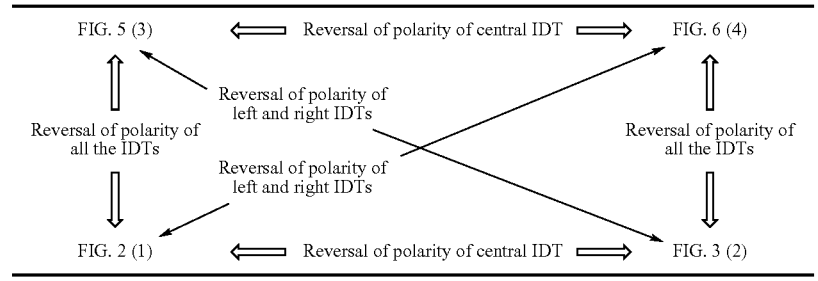

Therefore, surface acoustic wave devices having a function of conversion between balanced and unbalanced are constructed by combining surface acoustic wave filters that are 180 degrees offset in phase from each other out of the four surface acoustic wave filters shown here.

For example, when the surface acoustic wave filter 3 shown in FIG. 5 and the surface acoustic wave filter 4 shown in FIG. 6 are combined, the surface acoustic device B of the related example in FIG. 4 (called RELATED EXAMPLE 1 in order to distinguish that from other related examples to be described later) is obtained.

Figure 7:
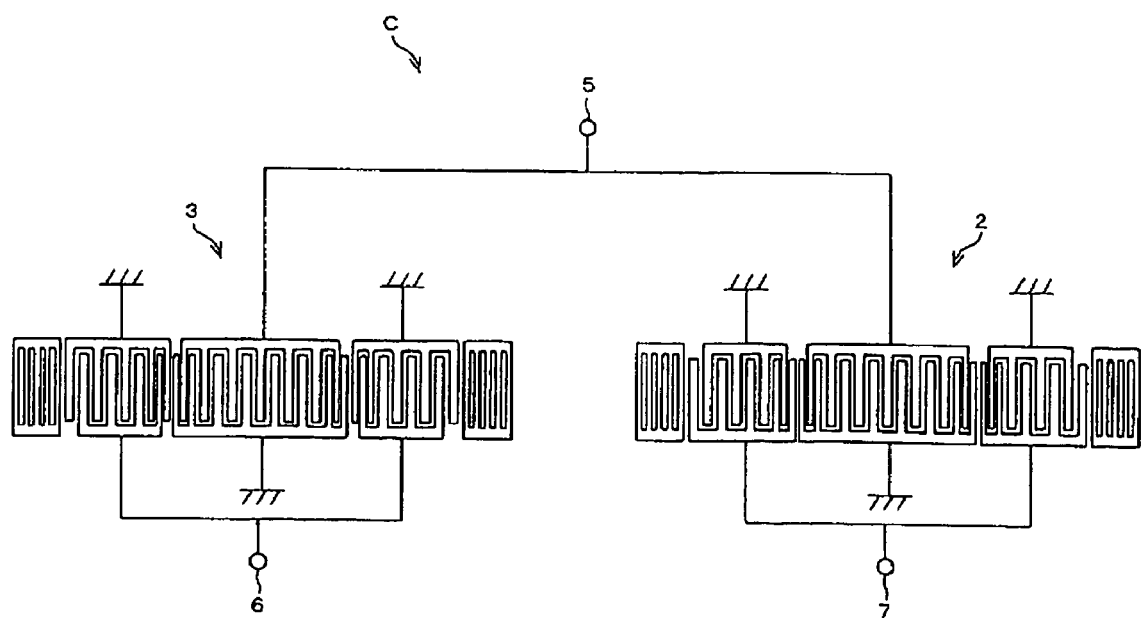
FIG. 7 shows a surface acoustic wave device of another related example.
Figure 8:
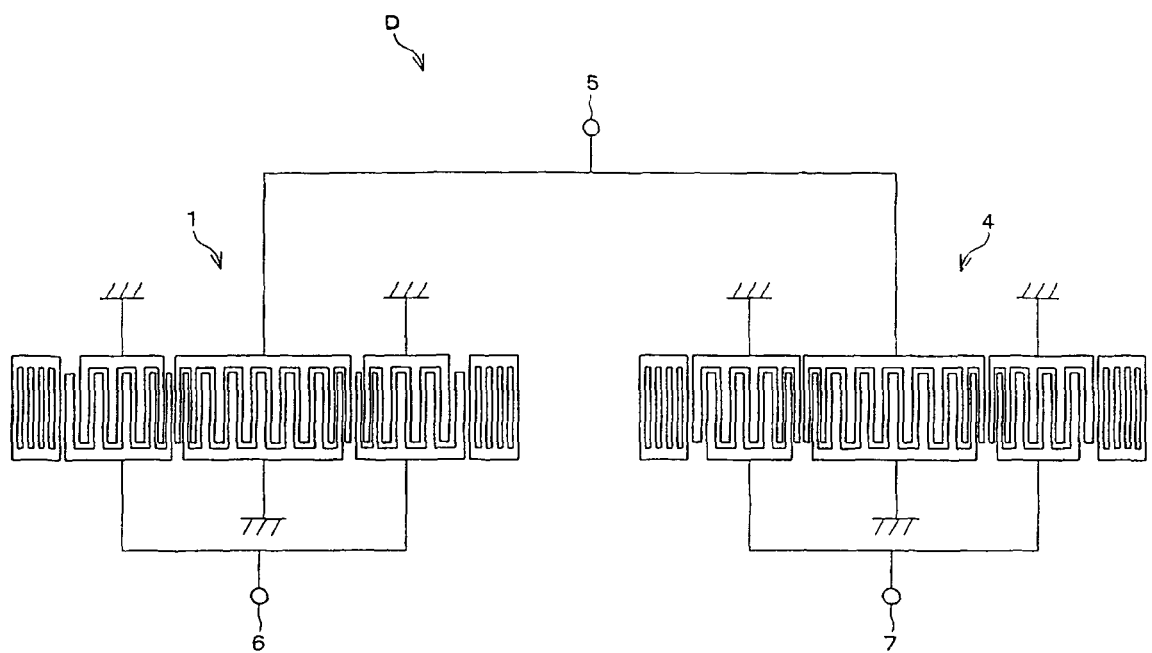
FIG. 8 shows a surface acoustic wave device according to another preferred embodiment of the present invention.

In the same manner, when the surface acoustic wave filter 3 shown in FIG. 5 and the surface acoustic wave filter 2 shown in FIG. 3 are combined, a surface acoustic wave device C of RELATED EXAMPLE 2 shown in FIG. 7 is obtained, when the surface acoustic wave filter 1 shown in FIG. 2 and the surface acoustic wave filter 4 shown in FIG. 6 are combined, a surface acoustic wave device D of EXAMPLE 2 shown in FIG. 8 is obtained, and when the surface acoustic wave filter 1 shown in FIG. 2 and the surface acoustic wave filter 2 shown in FIG. 3 are combined, the surface acoustic wave device A of EXAMPLE 1 shown in FIG. 1 is obtained.

Here, the filtering characteristics of the four surface acoustic wave filters (surface acoustic wave filter 1 shown in FIG. 2, surface acoustic wave filter 2 shown in FIG. 3, surface acoustic wave filter 3 shown in FIG. 5, and surface acoustic wave filter 4 shown in FIG. 6) are compared. The four surface acoustic wave filters are designed as follows.

Here, since the four surface acoustic wave filters 1 to 4 are designed in the same manner except for the polarities of the electrode fingers being different from each other, the surface acoustic wave filter 1 is taken as an example and described in detail. Furthermore, the electrode fingers (wavelength: $\lambda_2$) located in the vicinity of the boundary between IDTs have a shorter wavelength than the electrode fingers (wavelength: $\lambda_1$) of IDTs in the other portions ($\lambda_1 > \lambda_2$).

Hereinafter, a DCS reception filter is provided as an example and the operation, effect of preferred embodiments of the present invention are described.

Cross width W: 44.2 $\lambda_1$

Number of IDTs (in the order of 11, 12, and 13): 22 (3)/(3) 33 (3)/(3) 22, figures in the parentheses mean the number of electrode fingers of short wavelength ($\lambda_2$).

Wavelength $\lambda_1$ of IDTs: 2.15 μm

Wavelength $\lambda_2$ of IDTs: 1.93 μm

Wavelength $\lambda R$ of reflectors: 2.18 μm

Number of reflectors: 150

Space between IDTs($\lambda_1$) and IDTs($\lambda_2$): 0.25 $\lambda_1$+0.25 $\lambda_2$ Space between IDTs($\lambda_2$) and IDTs($\lambda_2$): 0.50 $\lambda_2$ Space between IDTs($\lambda_1$) and reflectors: 0.49 $\lambda_1$ Duty, IDTs($\lambda_1$): 0.63

Duty, IDTs($\lambda_2$): 0.60

Duty, reflectors: 0.57

Film thickness of electrodes: 0.093 $\lambda_1$

Figure 9:
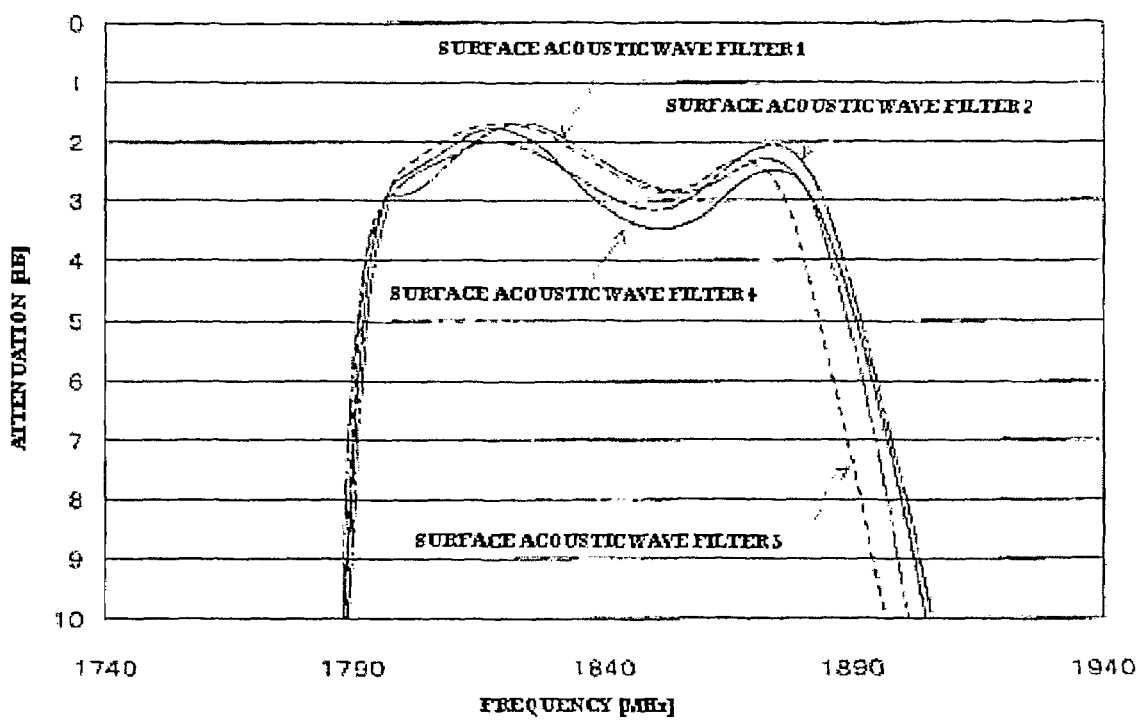
FIG. 9 is a graph for comparing the attenuation of the four surface acoustic wave filters shown in FIGS. 2, 3, 5, and 6.

In FIG. 9, the attenuation in the vicinity of the passband of the four surface acoustic wave filters 1 to 4 is shown. It is understood that only the surface acoustic wave filter 3 shown by a broken line in FIG. 9 has a narrower bandwidth and that the characteristics is greatly different in the high-frequency side of the passband from those of the other three surface acoustic wave filters 1, 2, and 4. Since the high-frequency side of the passband is determined by the excitation of a surface acoustic wave generated at the boundaries between IDTs, the surface acoustic wave filter 3 having no excited surface acoustic wave generated at the boundaries between IDTs has characteristics in which the high-frequency side of the passband is deteriorated.

As a surface acoustic wave device having a function of conversion between balanced and unbalanced which can be constructed by combination of surface acoustic wave filters being 180 degrees offset in phase from each other out of the four surface acoustic wave filters 1 to 4, the four kinds of surface acoustic wave A shown in FIG. 1, surface acoustic wave device B shown in FIG. 4, surface acoustic wave device C shown in FIG. 7, and surface acoustic wave device D shown in FIG. 8 as shown earlier are considered.

Figure 10:
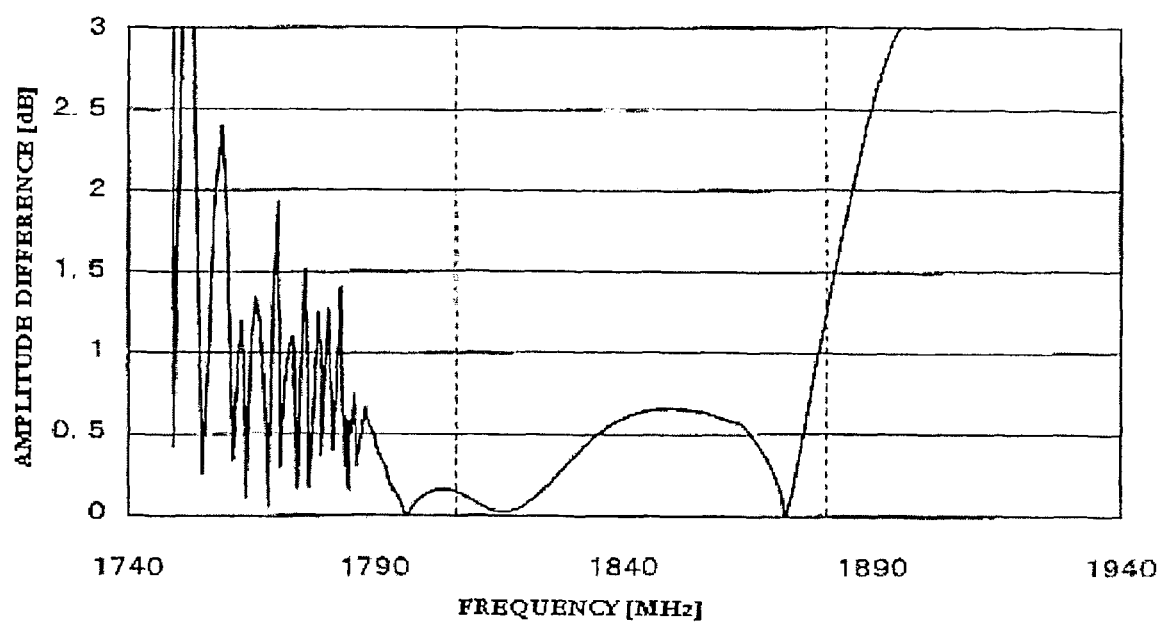
FIG. 10 is a graph showing the amplitude difference in the passband of the surface acoustic wave filters shown in FIGS. 5 and 6.
Figure 11:
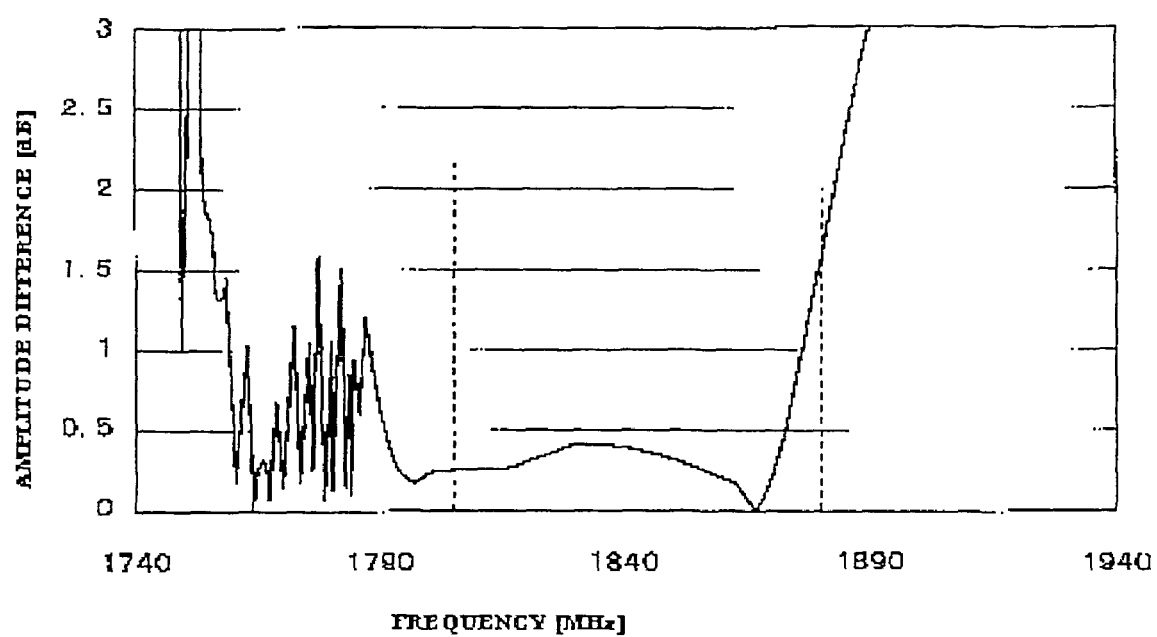
FIG. 11 is a graph showing the amplitude difference in the passband of the surface acoustic wave filters shown in FIGS. 3 and 5.
Figure 12:
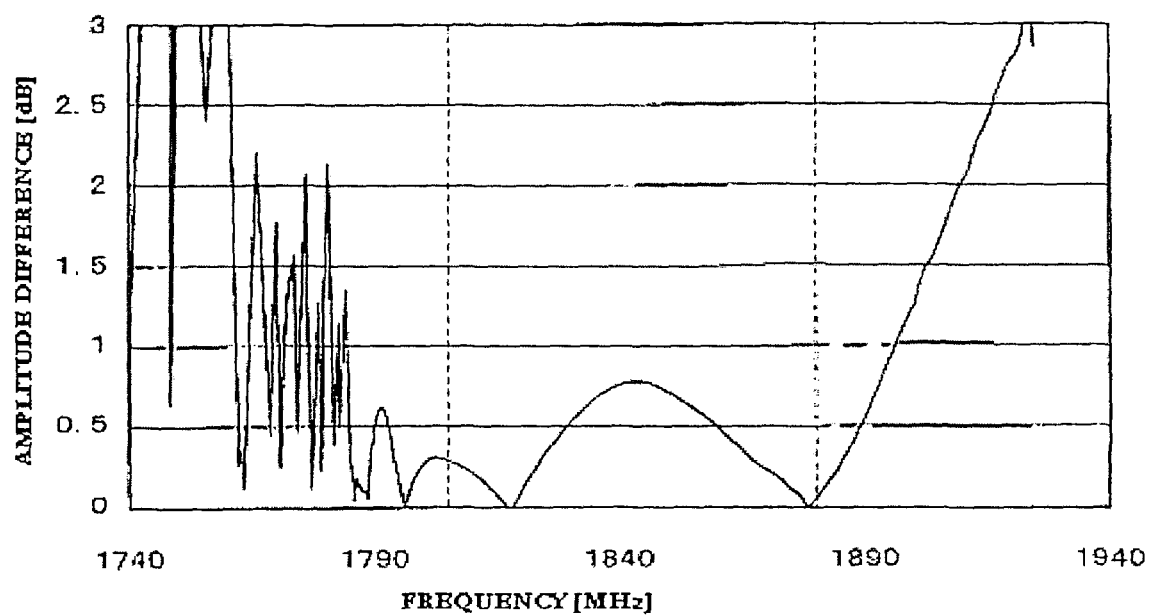
FIG. 12 is a graph showing the amplitude difference in the passband of the surface acoustic wave filters shown in FIGS. 2 and 6.

Regarding these four configurations, the amplitude difference (absolute value) in the vicinity of the passband of the two surface acoustic wave filters defining each of the surface acoustic wave devices is shown in FIGS. 10 to 13. The dotted lines in the drawings show the required bandwidth (1805 MHz to 1880 MHz) in a DCS reception system. Furthermore, FIG. 10 shows the amplitude difference in RELATED EXAMPLE 1.

Figure 13:
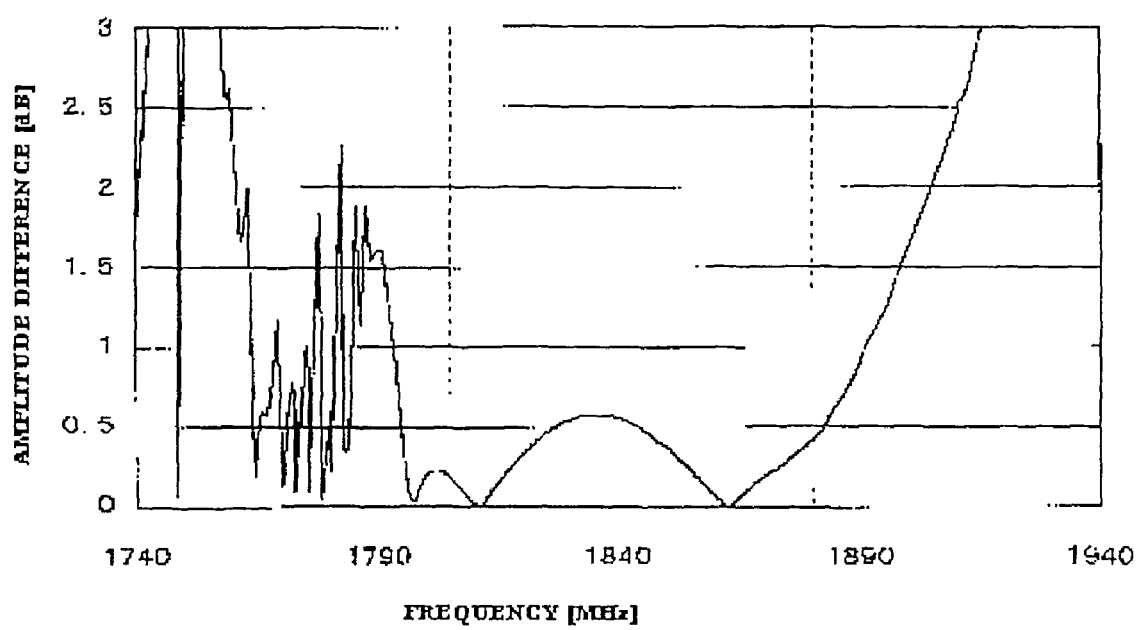
FIG. 13 is a graph showing the amplitude difference in the passband of the surface acoustic wave filters shown in FIGS. 2 and 3.

In Table 2, the maximum amplitude difference in the required bandwidth in the DCS reception system shown in FIGS. 10 to 13 is shown. When evaluated by using these maximum amplitude differences, although the maximum amplitude difference in the RELATED EXAMPLE 1 (the surface acoustic wave device B shown in FIG. 4) is about 1.2 dB within the passband as shown in FIG. 10, the maximum amplitude difference in preferred embodiments of the present invention (EXAMPLE 1: the surface acoustic wave device A shown in FIG. 1) is reduced to be about 0.6 dB as shown in FIG. 13, and thus, the balancing is improved.

Furthermore, in the surface acoustic wave device C (RELATED EXAMPLE 2) shown in FIG. 7 which includes the surface acoustic wave filter 3 having a narrow bandwidth similar to RELATED EXAMPLE 1, the maximum amplitude difference is about 1.5 dB (FIG. 1). On the other hand, in the surface acoustic wave device D (EXAMPLE 2) shown in FIG. 8 which does not include the surface acoustic wave filter 3, and includes the surface acoustic wave filter 1, the maximum amplitude difference is about 0.8 dB (FIG. 12), and thus, the balancing is improved.

Furthermore, these improvements are not reversed by the parameters of the substrate or the number f IDTs.

TABLE 2

| Surface acoustic wave device | B (FIG. 4) RELATED EXAMPLE 1 | C (FIG. 7) RELATED EXAMPLE 2 | D (FIG. 8) EXAMPLE 2 | A (FIG. 1) EXAMPLE 1 |
|---|---|---|---|---|
| Combination of surface acoustic wave filters | 3 and 4 | 2 and 3 | 1 and 4 | 1 and 2 |
| Amplitude difference [dB] | 1.2 (FIG. 10) | 1.5 (FIG. 11) | 0.8 (FIG. 12) | 0.6 (FIG. 13) |

According to the results illustrated above, the four combinations defining surface acoustic wave devices having a function of conversion between balanced and unbalanced by combining two surface acoustic wave filters that are 180 degrees offset in phase from each other out of the surface acoustic wave filter 1, the surface acoustic wave filter 2, the surface acoustic wave filter 3, and the surface acoustic wave filter 4, are classified into two groups.

One group (the surface acoustic wave device B shown in FIG. 4 and the surface acoustic wave device C shown in FIG. 7) includes the surface acoustic wave filter 3 where the grounded electrode fingers are arranged at the boundaries between IDTs as in RELATED EXAMPLE 1 and RELATED EXAMPLE 2.

The other group (the surface acoustic wave device A and the surface acoustic wave device C) does not include the surface acoustic wave filter 3 where the grounded electrode fingers are arranged at the boundaries between IDTs, but rather includes the surface acoustic wave filter 1, as in EXAMPLE 1 and EXAMPLE 2 of preferred embodiments of the present invention.

As shown in FIGS. 10 to 13, the amplitude difference within the passband in the surface acoustic wave devices A and D having the latter construction is less than in the surface acoustic wave devices B and C having the former construction.

Thus, when constructed as EXAMPLE 1 in FIG. 1 and EXAMPLE 2 FIG. 8, the amplitude difference between the two surface acoustic wave filters defining the surface acoustic wave devices is less than that of RELATED EXAMPLE 1 in FIG. 4.

The reason for this effect is described below. In FIG. 4, the surface acoustic wave device B having a function of conversion between balanced and unbalanced includes the surface acoustic wave filter 3 and the surface acoustic wave filter 4 which is 180 degrees offset in phase from the surface acoustic wave filter 3.

On the other hand, in FIG. 1, the surface acoustic wave device A having a function of conversion between balanced and unbalanced includes the surface acoustic wave filter 1 and the surface acoustic wave filter 2 which is 180 degrees offset in phase from the surface acoustic wave filter 1.

Furthermore, the polarity of all of the electrode fingers is reversed between the surface acoustic wave filter 3 and the surface acoustic wave filter 1, and, similarly, the polarity of all of the electrode fingers is reversed between the surface acoustic wave filter 2 and the surface acoustic wave filter 4.

What is to be noted here is the polarity of the electrode fingers at the boundaries between IDTs. In the surface acoustic wave filter 3 of RELATED EXAMPLE 1, since all of the outermost electrode-finger portions 31a, 32a, and 33a are grounded, the grounded electrode fingers are arranged at the boundaries between IDTs, and accordingly, no surface acoustic wave is excited.

On the other hand, in the surface acoustic wave filter 4, although the outermost electrode-finger portion 41a of the left IDT 41 and the outermost electrode-finger portion 43a of the right IDT 43 are grounded, since the electrode-finger portion 42a of the middle IDT 42 is connected to an unbalance signal terminal 5, the grounded electrode finger and the electrode finger connected to the signal terminal are arranged side by side, and accordingly, a surface acoustic wave is excited.

Therefore, in the surface acoustic wave filter 3 and the surface acoustic wave filter 4, filtering characteristics are substantially different and the amplitude difference is increased.

On the other hand, in the surface acoustic wave filter 1 defining the surface acoustic wave device in FIG. 1, because the outermost electrode-finger portions 11a, 12a, and 13a, are connected to an unbalanced terminal 5 or a balanced terminal 6 as a signal terminal, a surface acoustic wave is excited.

In the surface acoustic wave filter 2, the electrode-finger portion 22a of the middle IDT 22, to which the adjacent electrode fingers at the boundaries between IDTs belong is grounded, the electrode-finger portion 21a of the left IDT 21 and the electrode-finger portion 23a of the right IDT 23 are connected to a signal terminal, and the grounded electrode finger and the electrode finger connected to a signal terminal are arranged side by side at the boundaries between IDTs, and accordingly a surface acoustic wave is excited.

Therefore, a surface acoustic wave is excited at the boundaries between IDTs of both of the surface acoustic wave filter 1 and the surface acoustic wave filter 2. Because of this, when compared to RELATED EXAMPLE 1, the characteristics of the two surface acoustic wave filters are very similar to each other and the amplitude difference is greatly reduced as compared to RELATED EXAMPLE 1.

The same thing can be said in FIG. 8 showing EXAMPLE 2, and, in both of the two surface acoustic wave filters (the surface acoustic wave filter 1 and the surface acoustic wave filter 4) defining EXAMPLE 2, since any grounded outermost electrode fingers are not arranged side by side in the boundaries between IDTs, the characteristics of the two surface acoustic wave filters 1 and 4 are very similar to each other and the amplitude difference is greatly reduced as compared to RELATED EXAMPLE 1.

According to preferred embodiments of the present invention, when compared with RELATED EXAMPLE 1 and RELATED EXAMPLE 2, the amplitude difference between the two surface acoustic wave filters is greatly reduced such that the surface acoustic wave filters defining a surface acoustic wave device having a function of conversion between balanced and unbalanced are constructed so as to have no grounded electrode fingers arranged side by side at the boundaries between IDTs, and a surface acoustic wave device, greatly improved balancing, particularly the amplitude balancing inside the passband is obtained.

Furthermore, a surface acoustic wave filter 3 having a function of conversion between balanced and unbalanced, and having an increased bandwidth, as compared with RELATED EXAMPLE 1 and RELATED EXAMPLE 2, is obtained.

Next, the amplitude balancing characteristics, attenuation characteristics, and bandwidth of surface acoustic wave devices having a function of conversion between balanced and unbalanced are compared. A surface acoustic wave device E shown in FIG. 14, including the surface acoustic wave device B shown in FIG. 4 is denoted as RELATED EXAMPLE 3. On the other hand, a surface acoustic wave device F shown in FIG. 15 including the surface acoustic wave device A shown in FIG. 1 is denoted as EXAMPLE 3. The surface acoustic wave device E and the surface acoustic wave device F are compared.

Figure 14:
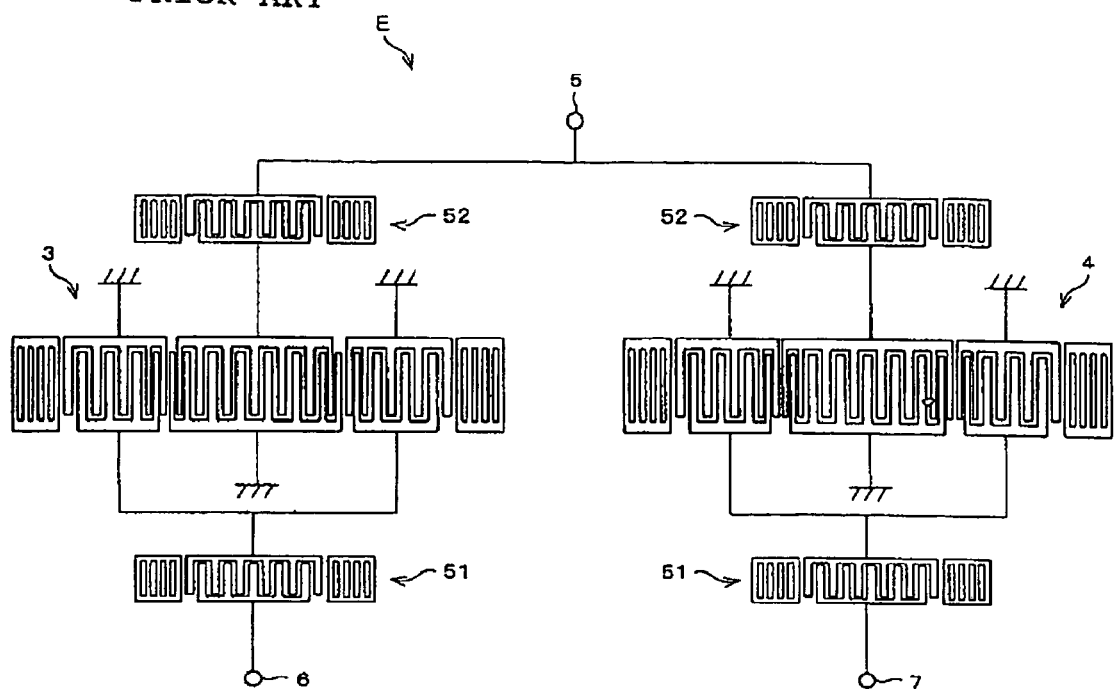
FIG. 14 shows a surface acoustic wave device of another related example.
Figure 15:
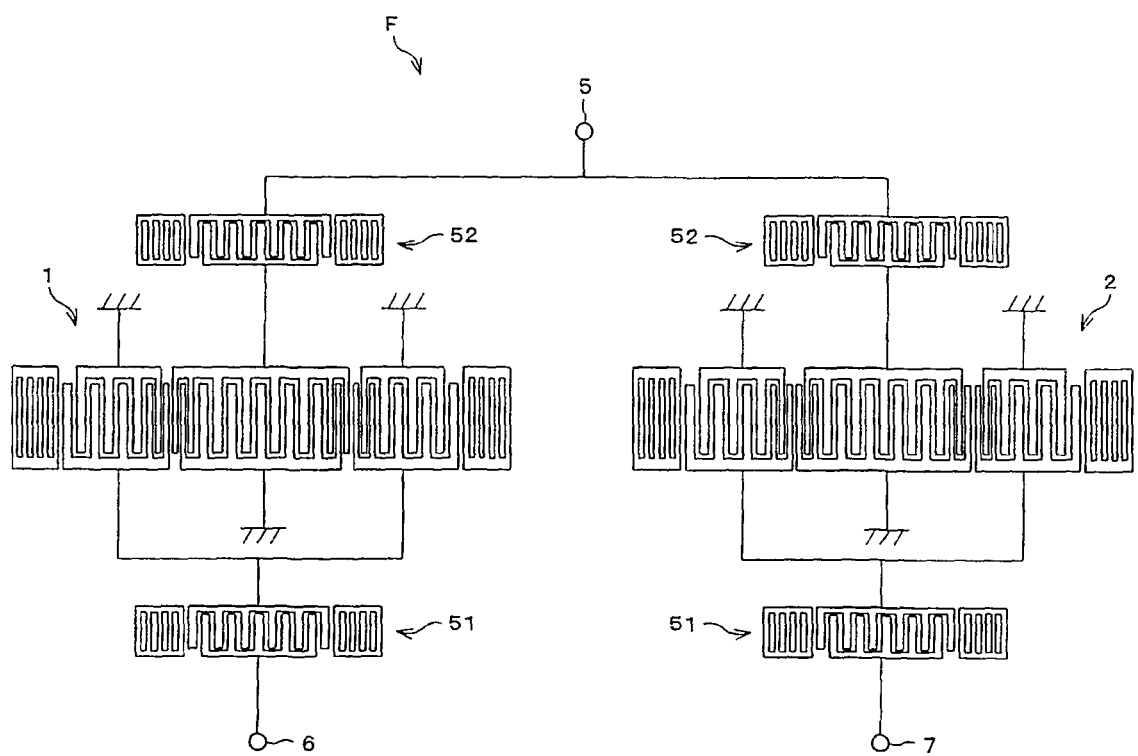
FIG. 15 shows the construction in outline of a surface acoustic wave device of another example according to preferred embodiments of the present invention.

In RELATED EXAMPLE 3 in FIG. 14 and EXAMPLE 3 in FIG. 15, first traps 51 and second traps 52 are provided in the surface acoustic wave device B shown in FIG. 4 and the surface acoustic wave device A shown in FIG. 1, respectively.

These traps 51 and 52 include an IDT and reflectors sandwiching the IDT, and the traps are provided to ensure the attenuation outside the passband. The traps provided in RELATED EXAMPLE 3 and EXAMPLE 3 are designed and connected in the same manner. The detailed design of the first traps 51 is as follows.

Cross width W: 19.4 $\lambda_1$
Number of pairs of IDTs: 120
Wavelength $\lambda_1$ of IDTs: 2.08 µm
Wavelength $\lambda R$ of reflectors: 2.08 µm
Number of reflectors: 30
Space between IDTs and reflectors: 0.50 $\lambda_1$
Duty factor of IDTs: 0.60
Duty factor of reflectors: 0.60
Film thickness of electrodes: 0.096 $\lambda_1$ The detailed design of the second traps 52 is as follows.
Cross width W: 36.5 $\lambda_1$
Number of pairs of IDTs: 120
Wavelength $\lambda_1$ of IDTs: 2.05 µm
Wavelength $\lambda R$ of reflectors: 2.05 µm
Number of reflectors: 30
Space between IDTs and reflectors: 0.50 $\lambda_1$
Duty factor of IDTs: 0.60
Duty factor of reflectors: 0.60

Film thickness of electrodes: 0.098 $\lambda_1$

In the surface acoustic wave device F shown in FIG. 15 as EXAMPLE 3, the first traps 51 are connected in series between the surface acoustic wave filter 1 and the balanced terminal 6 and between the surface acoustic wave filter 2 and the balanced terminal 7, respectively, and the second traps 52 are connected in series between the surface acoustic wave filter 1 and the unbalanced terminal 5 and between the surface acoustic wave filter 2 and the unbalanced terminal 5, respectively. That is, the second traps 52 are connected in parallel from the side of the unbalanced terminal 5.

In this manner, the surface acoustic wave device F having a function of conversion between balanced and unbalanced is constructed. Furthermore, the surface acoustic wave device E shown in FIG. 14 as RELATED EXAMPLE 3 is constructed in the same manner to include the traps 51 and 52, and has a function of conversion between balanced and unbalanced.

Figure 16:
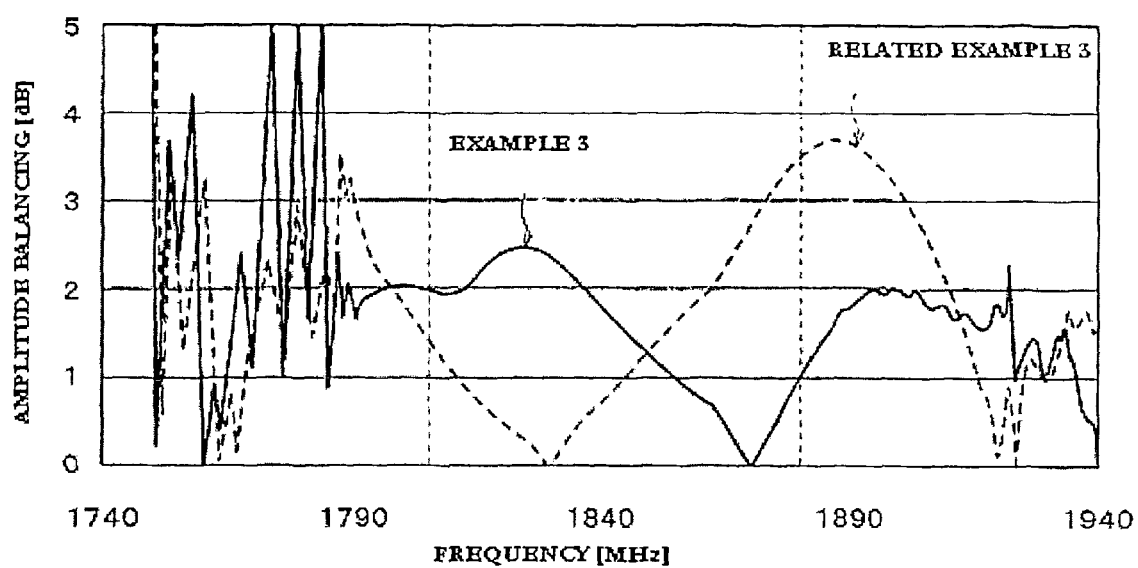
FIG. 16 is a graph for comparing the amplitude balancing of the other related example and the other example.
Figure 17:
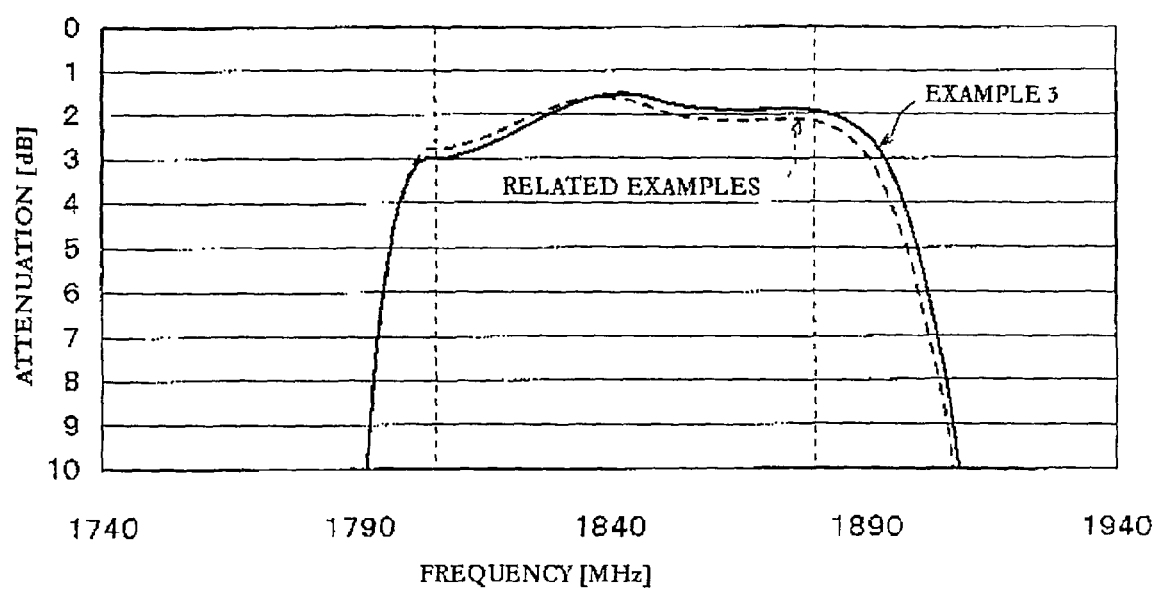
FIG. 17 is a graph for comparing the attenuation of the other related example and the preferred embodiment shown in FIG. 8.
Figure 18:
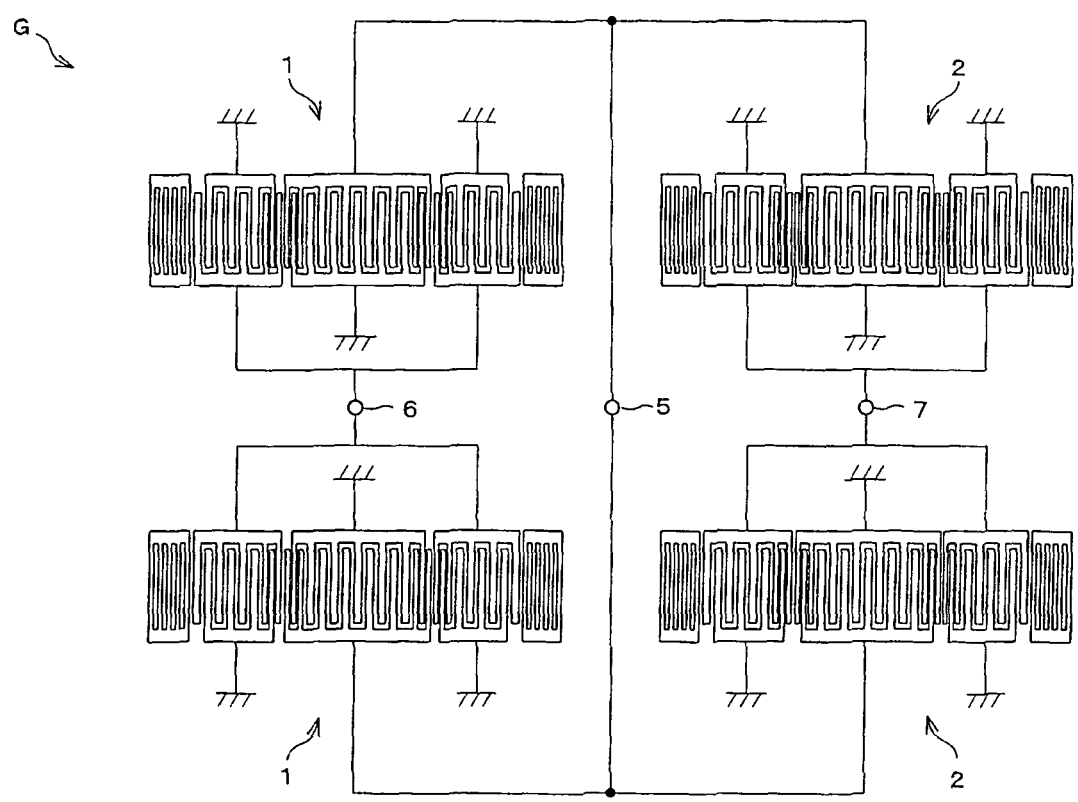
FIG. 18 shows a surface acoustic wave device according to another preferred embodiment of the present invention.
Figure 19:
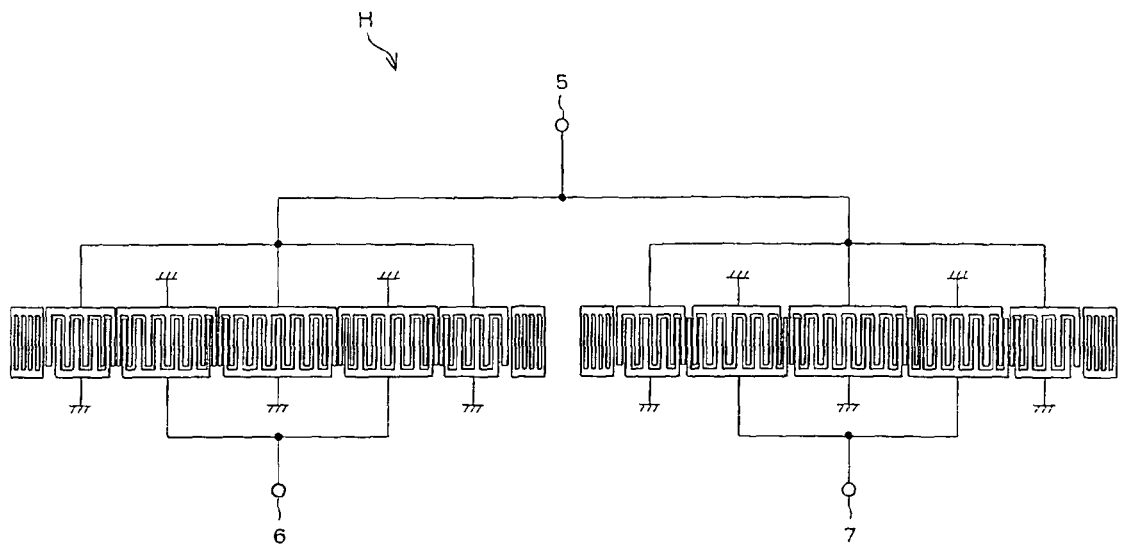
FIG. 19 shows a surface acoustic wave device according to another preferred embodiment of the present invention.

The amplitude balancing in the vicinity of the passband (1805 MHz to 1880 MHz) of EXAMPLE 3 shown in FIG. 15 is shown in FIG. 16 and the attenuation is shown in FIG. 17. Furthermore, the characteristics of RELATED EXAMPLE 3 shown in FIG. 14 are also shown for comparison.

When the amplitude balancing is compared in FIG. 16, although the amplitude balancing of RELATED EXAMPLE 3 is about 3.5 dB on the higher-frequency side of the passband, the amplitude balancing of EXAMPLE 3 is improved on the higher-frequency side of the passband to about 1 dB. Even if the amplitude balancing is compared over the entire frequency area inside the passband, although the amplitude balancing of RELATED EXAMPLE 3 is about 3.5 dB, the amplitude balancing of EXAMPLE 3 is improved to about 2.5 dB. In this manner, the amplitude balancing, particularly the amplitude balancing on the higher-frequency side of the passband is greatly improved.

Furthermore, as clearly seen in FIG. 17 in which the attenuation is compared, as another effect, the width of the passband of EXAMPLE 3 is expanded as compared to RELATED EXAMPLE 3 (94 MHz with RELATED EXAMPLE 3 and 100 MHz with EXAMPLE 3 under the condition of 4 dB bandwidth).

Moreover, although a 40±5 degrees Y cut X propagation LiTaO$_3$ substrate is preferably used in EXAMPLE 3, in the present invention, the material is not limited to this substrate, and, even if substrates of 64 to 72 degrees Y cut X propagation LiNbO$_3$, 41 degrees Y cut X propagation LiNbO$_3$, or other suitable substrate, are used, the same effect is obtained.

Furthermore, the surface acoustic wave device A in FIG. 1 is provided in EXAMPLE 3. However, if the surface acoustic wave device D in FIG. 8 is provided, the same effect is obtained. In EXAMPLE 3, a surface acoustic wave device including two of three-IDT type longitudinally coupled resonator surface acoustic wave filters is provided as an example in EXAMPLE 3. However, a surface acoustic wave device G (another example of EXAMPLE 4) using four surface acoustic wave filters as in FIG. 18 without limiting the number of surface acoustic wave filters to two, a surface acoustic wave device H (another example of EXAMPLE 5) having five IDTs, instead of three IDTs, in surface acoustic wave filters as in FIG. 19, and other surface acoustic wave devices made of surface acoustic wave filters having two or more IDTs also produces the same effect, such that grounding both of the adjacent outermost electrode fingers is avoided. The same effect is obtained such that, in designing each surface acoustic filter, the cross width and the number of IDTs are arbitrarily changed and the traps are changed to increase or decrease as required in order to obtain desired frequency characteristics.

Figure 20:
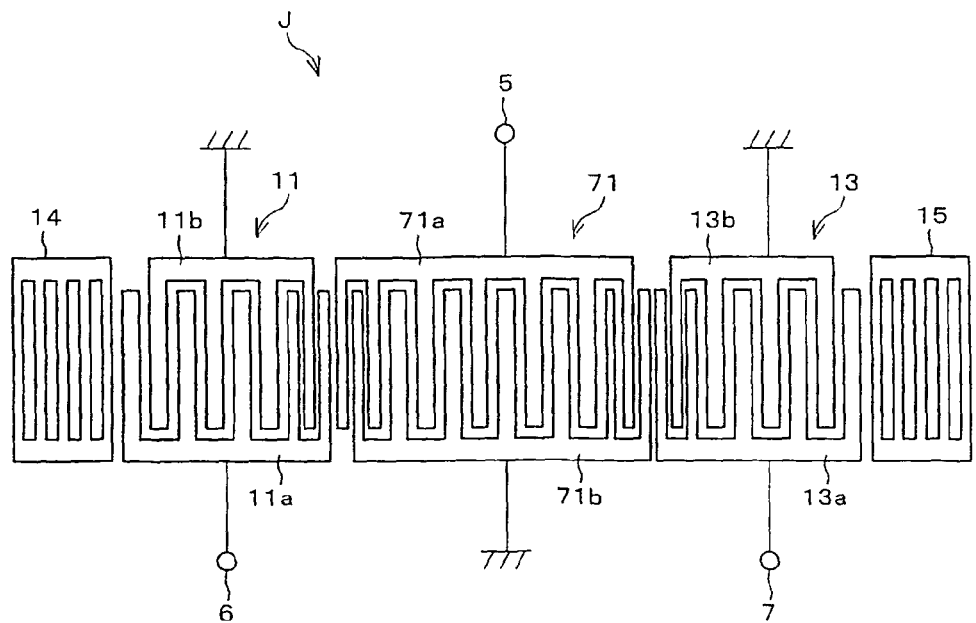
FIG. 20 shows a surface acoustic wave device according to another preferred embodiment of the present invention.

Next, another example of EXAMPLE 6 of preferred embodiments of the present invention is described. FIG. 20 shows a surface acoustic wave device J having a function of conversion between balanced and unbalanced according to EXAMPLE 6. FIG. 20 shows one longitudinally coupled resonator type surface acoustic wave filter having three IDTs, the IDT 11 and IDT 13 are arranged on the left and right sides of the middle IDT 71 in the propagation direction of a surface acoustic wave, and a reflector 14 and a reflector 15 are arranged on both sides of the left and right IDTs 11 and 13.

The unbalanced terminal 5 is connected to the electrode-finger portion 71a of the IDT 71. One balanced terminal 6 is connected to the electrode-finger portion 11a of the IDT 11. The other balanced terminal 7 is connected to the electrode-finger portion 13a of the IDT 11. According to EXAMPLE 6, the phases at the IDTs 11 and 13 symmetrically arranged on both left and right sides of the middle IDT 71 are 180 degrees offset from each other such that the total number of electrode fingers of the middle IDT 71 connected to the unbalanced terminal 5 is preferably an even number and grounding both of the adjacent outermost electrode fingers is avoided. Thus, a surface acoustic wave device according to preferred embodiments of the present invention which has a function of conversion between balanced and unbalanced and greatly improved balancing is obtained.

Figure 21:
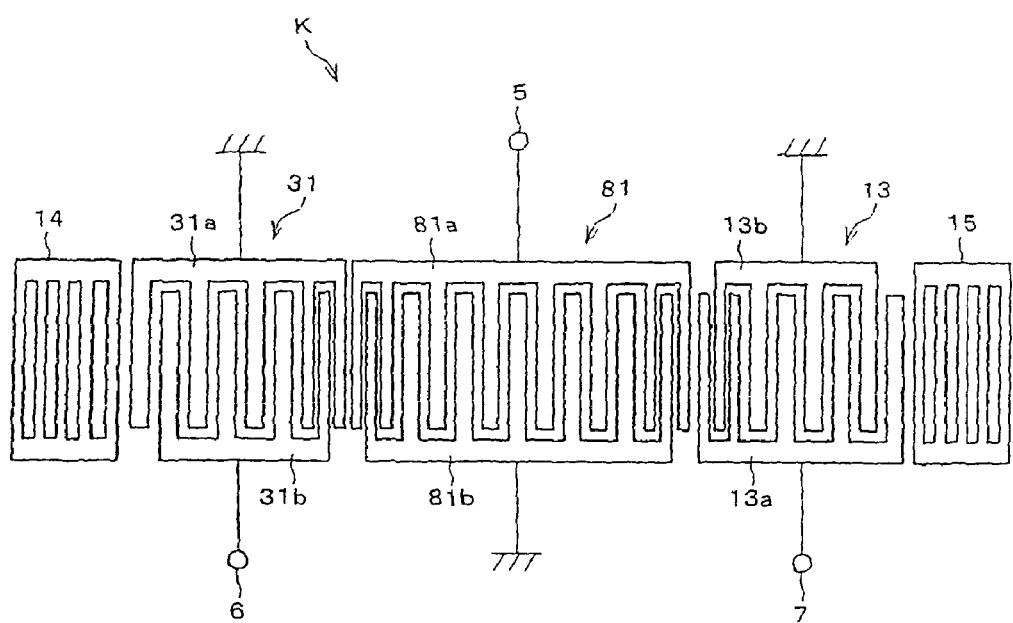
FIG. 21 shows a surface acoustic wave device according to another preferred embodiment of the present invention.

Next, a surface acoustic wave device K having a function of conversion between balanced and unbalanced according to another example (EXAMPLE 7), which is shown in FIG. 21, is described. The difference between FIG. 21 and FIG. 20 is that the polarity of the electrode-finger portions is reversed by making the number of electrode fingers of the middle IDT 81 an odd number and by using the above IDT 31 instead of the left and right IDTs, for example, instead of the IDT 11. Thus, a surface acoustic wave device K having a function of conversion between balanced and unbalanced according to preferred embodiments of the present invention is obtained.

Regarding the polarity of the adjacent outermost electrode fingers at the boundaries between IDTs of the surface acoustic wave device J in FIG. 20, both the electrode-finger portion 11a and the electrode-finger portion 71a are connected to signal terminals.

Furthermore, regarding the electrode-finger portion 71b and the electrode-finger portion 13a, the electrode-finger portion 71b is grounded, but the electrode-finger portion 13a is connected to a signal terminal. Accordingly, since grounded electrode fingers are not arranged side by side at the boundaries between IDTs, excellent balancing and increased bandwidth filtering characteristics are obtained in the same manner as in EXAMPLE 1.

Furthermore, in EXAMPLE 7 in FIG. 21, regarding the electrode-finger portion 31a and the electrode-finger portion 81a, although the electrode-finger portion 31a is grounded, the electrode-finger portion 81a is connected to a signal terminal, and both of the electrode-finger portion 31a and the electrode-finger portion 81a are connected to signal terminals.

Therefore, in the same manner as in EXAMPLE 6 in FIG. 20, grounded electrode fingers are not arranged side by side at the boundaries between IDTs, and accordingly excellent balancing and increase bandwidth filtering characteristics are obtained in the same manner as in EXAMPLE 1.

In the same manner as in EXAMPLE 1, not only a 40±5 degrees Y cut X propagation LiTaO₃ substrate, but also substrates of 64 to 72 degrees Y cut X propagation LiNbO₃, 41 degrees Y cut X propagation LiNbO₃, etc., produce the same effect.

The number of IDTs is not limited to three, and, even if the cross width and the number of IDTs are changed and traps are included when required in order to obtain desired frequency characteristics, the same effect is produced.

Figure 22:
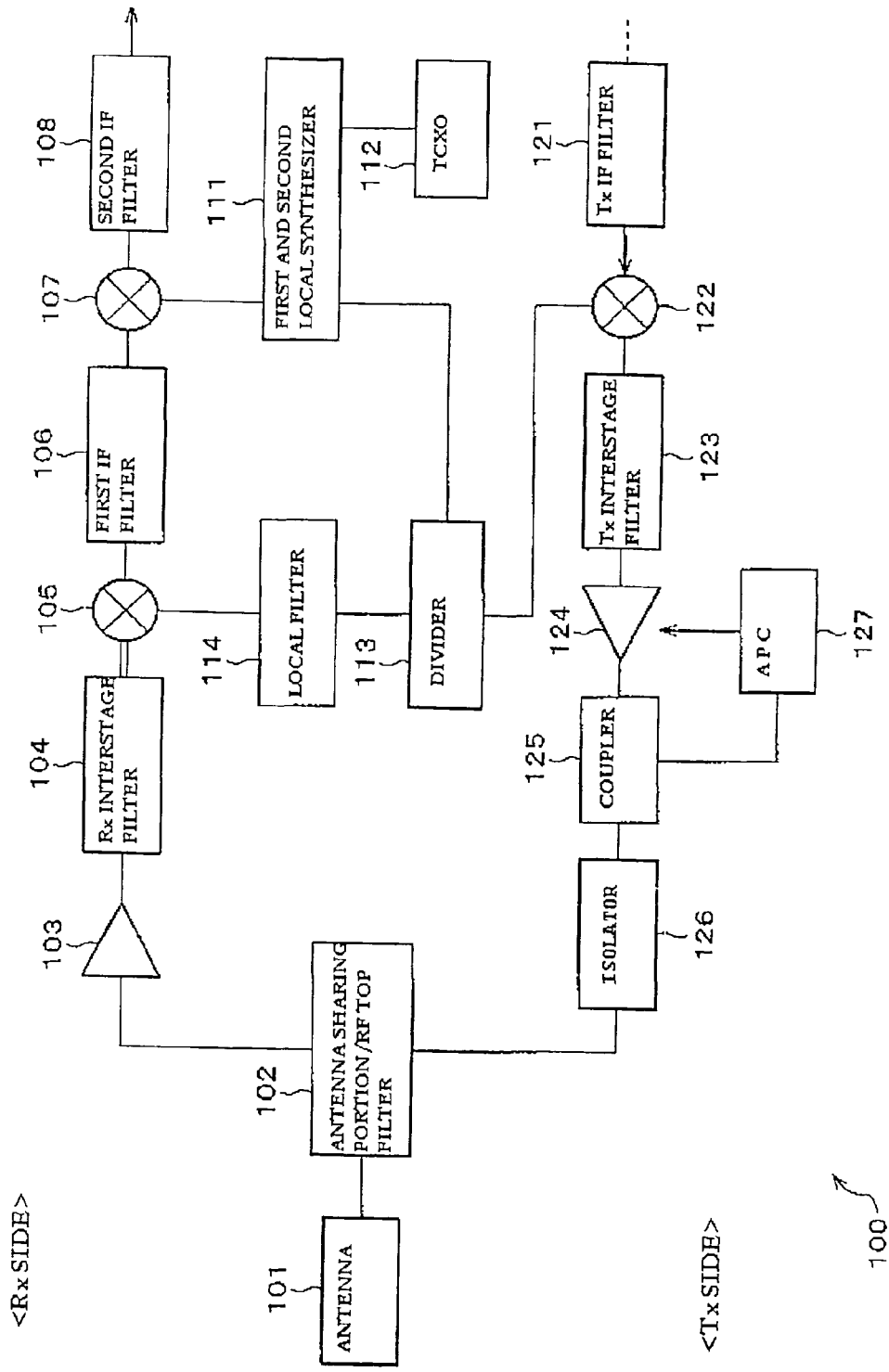
FIG. 22 is a block diagram of the essential portion of a communication device using a surface acoustic wave device according to preferred embodiments of the present invention.

Next, a communication device according to another preferred embodiment of the present invention is described with reference to FIG. 22. As shown in FIG. 22, in the communication device 100, the receiver side (R_x side) for reception includes an antenna 101, an antenna sharing portion/RF top filter 102, an amplifier 103, an R_x interstage filter 104, a mixer 105, a first IF filter 106, a mixer 107, a second IF filter 108, first and second synthesizers 111, a TCXO (temperature compensated crystal oscillator) 112, a driver 113, and a local filter 114.

As shown by a double line in FIG. 22, it is desirable to transmit balanced signals from the R_x interstage filter 104 to the mixer 105 to ensure balancing.

Furthermore, in the communication device, the transmitter side (T_x side) for transmission includes the antenna 101, the antenna sharing portion/RF top filter 102, a T_x IF filter 121, a mixer 122, a T_x interstage filter 123, an amplifier 124, a coupler 125, an isolator 126, and an APC (automatic power control) 127.

Then, in the above R_x interstage filter 104, first IF filter 106, T_x IF filter 121, T_x interstage filter 123, the surface acoustic wave devices according to preferred embodiments of the present invention (EXAMPLE 1 to EXAMPLE 7) are preferably utilized.

A surface acoustic wave device according to preferred embodiments of the present invention has a function of conversion between balanced and unbalanced together with a filtering function, and, in addition, has greatly improved amplitude characteristics and phase characteristics between balanced signals.

Therefore, including a communication device using the above-described surface acoustic wave device according to a preferred embodiment of the present invention, because of the surface acoustic wave device used, when the frequency band for use is increased, the size of the communication device is greatly reduced, and the transmission characteristics are greatly improved due to the excellent function of conversion between balanced and unbalanced.

While preferred embodiments of the invention have been described above, it is to be understood that variations and modifications will be apparent to those skilled in the art without departing the scope and spirit of the invention. The scope of the invention, therefore, is to be determined solely by the following claims.

The invention claimed is:

1. A surface acoustic wave device comprising:
a piezoelectric substrate;
two surface acoustic wave fitters, each of said two surface acoustic wave filters including three comb-shaped electrode portions arranged along the propagation direction of surface acoustic waves on the piezoelectric substrate, a middle one of the three comb-shaped electrode portions is connected to an unbalanced terminal and the left and right comb-shaped electrode portions are connected to balanced terminals so as to provide a balanced to unbalanced conversion function; wherein
at least one electrode finger of outermost electrode fingers in each of said three comb-shaped electrode portions of at least one of said two surface acoustic wave filters is connected to one of said unbalanced terminal and said balanced terminals;
the phase of said two surface acoustic wave filters is 180 degrees offset from each other;
the phase of the left and right comb-shaped electrode portions of one of said two surface acoustic wave filters is 180 degrees offset from each other;
the two surface acoustic wave filters are longitudinally coupled resonator type surface acoustic wave filters; and
in one of the two surface acoustic wave filters, at least one electrode finger of outermost electrode fingers in one of said three comb-shaped electrode portions is connected to ground.

2. A surface acoustic wave device according to claim 1, wherein the piezoelectric substrate is one of a 40±5 degrees Y cut X propagation LiTaO₃ substrate, a 64 to 72 degrees Y cut X propagation LiNbO₃ substrate, and a 41 degrees Y cut X propagation LiNbO₃.

3. A surface acoustic wave device according to claim 1, wherein the electrode fingers that are connected to ground are not arranged side by side at the boundaries between said three comb-shaped electrode portions.

4. A communication device comprising a surface acoustic wave device according to claim 1.

5. A surface acoustic wave device comprising:
a piezoelectric substrate;
two surface acoustic wave filters, each of said two surface acoustic wave filters including three comb-shaped electrode portions arranged along the propagation direction of surface acoustic waves on the piezoelectric substrate, a middle one of the three comb-shaped electrode portions is connected to an unbalanced terminal and the left and right comb-shaped electrode portions are connected to balanced terminals so as to provide a balanced to unbalanced conversion function; wherein
electrode fingers facing each other in each of said three comb-shaped electrode portions are provided to be able to excite the surface acoustic waves between the electrode fingers;
the phase of said two surface acoustic wave filters is 180 degrees offset from each other;
the phase of the left and right comb-shaped electrode portions of one of said two surface acoustic wave filters is 180 degrees offset from each other;
the two surface acoustic wave filters are longitudinally coupled resonator type surface acoustic wave filters; and
in one of the two surface acoustic wave filters, at least one electrode finger of outermost electrode fingers in one of said three comb-shaped electrode portions is connected to ground.

6. A surface acoustic wave device according to claim 5, wherein the piezoelectric substrate is one of a 40±5 degrees Y cut X propagation LiTaO₃ substrate, a 64 to 72 degrees Y cut X propagation LiNbO₃ substrate, and a 41 degrees Y cut X propagation LiNbO₃.

7. A surface acoustic wave device according to claim 5, wherein the electrode fingers that are connected to ground are not arranged side by side at the boundaries between said three comb-shaped electrode portions.

8. A communication device comprising a surface acoustic wave device according to claim 5.

9. A surface acoustic wave device comprising:
a piezoelectric substrate;
four surface acoustic wave filters, each of said four surface acoustic wave filters including three comb-shaped electrode portions arranged along the propagation direction of surface acoustic waves on the piezoelectric substrate, a middle one of the three comb-shaped electrode portions is connected to an unbalanced terminal and the left and right comb-shaped electrode portions are connected to balanced terminals so as to provide a balanced to unbalanced conversion function; wherein at least one electrode finger of outermost electrode fingers in each of said three comb-shaped electrode portions of at least one of said four surface acoustic wave filters is connected to one of said unbalanced terminal and said balanced terminals;

the phase of at least one of said four surface acoustic wave filters is 180 degrees offset from to the remainder of said four surface acoustic wave filters;

the phase of the left and right comb-shaped electrode portions of at least one of said four surface acoustic wave filters is 180 degrees offset from each other; and the four surface acoustic wave filters are longitudinally coupled resonator type surface acoustic wave filters.

* * * * *